(12) United States Patent
Shafer

(10) Patent No.: US 11,486,222 B2
(45) Date of Patent: Nov. 1, 2022

(54) P AND A SETTING WITH EXOTHERMIC MATERIAL

(71) Applicant: CONOCOPHILLIPS COMPANY, Houston, TX (US)

(72) Inventor: Randall S. Shafer, Houston, TX (US)

(73) Assignee: CONOCOPHILLIPS COMPANY, Houston, TX (US)

( * ) Notice: Subject to any disclaimer, the term of this patent is extended or adjusted under 35 U.S.C. 154(b) by 161 days.

(21) Appl. No.: 16/944,727

(22) Filed: Jul. 31, 2020

(65) Prior Publication Data

US 2020/0366274 A1   Nov. 19, 2020

Related U.S. Application Data

(63) Continuation of application No. 16/291,010, filed on Mar. 4, 2019.

(Continued)

(51) Int. Cl.
| | |
|---|---|
| *E21B 36/00* | (2006.01) |
| *E21B 33/134* | (2006.01) |
| *E21B 29/00* | (2006.01) |
| *E21B 33/12* | (2006.01) |
| *H03H 9/54* | (2006.01) |
| *H03H 9/58* | (2006.01) |
| *H03H 9/60* | (2006.01) |

(Continued)

(52) U.S. Cl.
CPC ............ *E21B 33/134* (2013.01); *E21B 29/00* (2013.01); *E21B 33/1204* (2013.01); *E21B 36/00* (2013.01); *E21B 36/008* (2013.01); *H03H 9/542* (2013.01); *H03H 9/582* (2013.01); *H03H 9/605* (2013.01); *H03H 9/6483* (2013.01); *H03H 9/706* (2013.01); *H03H 9/725* (2013.01)

(58) Field of Classification Search
CPC .... E21B 33/134; E21B 29/00; E21B 33/1204; B21B 36/008; H03H 9/542; H03H 9/582; H03H 9/605; H03H 9/6483; H03H 9/706; H03H 9/725
See application file for complete search history.

(56) References Cited

U.S. PATENT DOCUMENTS

| 3,195,637 A | * | 7/1965 | Wayte | ................... E21B 36/008 166/58 |
|---|---|---|---|---|
| 6,477,714 B1 | | 11/2002 | Gonzalez | |

(Continued)

FOREIGN PATENT DOCUMENTS

CN   104334822 B   *   9/2017

OTHER PUBLICATIONS

International Search Report for parent case, App. No. PCT/US2018/065446, dated Feb. 27, 2019.

*Primary Examiner* — Dinh T Le
(74) *Attorney, Agent, or Firm* — Boulware & Valoir

(57) ABSTRACT

A method of plugging a hydrocarbon well includes deploying a downhole tool to remove at least a portion of a casing at a section of well to be plugged. Deploying a blocking device downhole to block a bottom of the section of well to be plugged. Deploying a plugging material downhole onto the blocking device to fill an area to be plugged. Deploying an exothermic fluid downhole, wherein activation of the exothermic material liquefies the plugging material. Allowing the plugging material and the exothermic fluid to solidify form a cast-in-place plug that fills the section of well to be plugged.

9 Claims, 4 Drawing Sheets

Related U.S. Application Data

(60) Provisional application No. 62/598,680, filed on Dec. 14, 2017.

(51) Int. Cl.
*H03H 9/64* (2006.01)
*H03H 9/70* (2006.01)
*H03H 9/72* (2006.01)

(56) References Cited

U.S. PATENT DOCUMENTS

| | | | |
|---|---|---|---|
| 6,664,522 B2 | 12/2003 | Spencer | |
| 6,828,531 B2 | 12/2004 | Spencer | |
| 6,923,263 B2 * | 8/2005 | Eden | E21B 36/00 166/179 |
| 7,152,657 B2 | 12/2006 | Bosma | |
| 7,290,609 B2 | 11/2007 | Wardlaw | |
| 10,113,386 B2 | 10/2018 | Carragher | |
| 2006/0144591 A1 * | 7/2006 | Gonzalez | E21B 29/10 166/57 |
| 2010/0006289 A1 | 1/2010 | Spencer | |
| 2013/0087335 A1 | 4/2013 | Carragher | |
| 2013/0333890 A1 | 12/2013 | Degenais | |
| 2015/0034317 A1 | 2/2015 | Skjold | |
| 2015/0053405 A1 | 2/2015 | Bakken | |
| 2015/0211322 A1 | 7/2015 | Lowry et al. | |
| 2015/0345248 A1 | 12/2015 | Carragher | |
| 2015/0368542 A1 | 12/2015 | Carragher | |
| 2016/0145962 A1 | 5/2016 | Carragher | |
| 2018/0094504 A1 | 4/2018 | Hearn | |
| 2018/0148991 A1 | 5/2018 | Hearn | |
| 2018/0216437 A1 | 8/2018 | Shafer | |
| 2018/0258735 A1 | 9/2018 | Shafer | |
| 2018/0298715 A1 | 10/2018 | Shafer | |
| 2019/0186233 A1 * | 6/2019 | Shafer | H03H 9/725 |

* cited by examiner

P AND A SETTING WITH EXOTHERMIC MATERIAL

PRIOR RELATED APPLICATIONS

This application is a continuation of U.S. Ser. No. 16/291,010 filed on Dec. 13, 2018, which is a non-provisional application claiming benefit under 35 USC § 119(e) to U.S. Provisional Application Ser. No. 62/598,680 filed Dec. 14, 2017. Each application is incorporated by reference in its entirety herein for all purposes.

FIELD OF THE INVENTION

The invention relates to methods, systems and devices for plug and abandonment operations to shut down a well or a portion thereof.

BACKGROUND

The decision to plug and abandon a well or field is often based on simple economics. Once production value drops below operating expenses, it is time to consider abandonment, even if considerable reserves remain. It is also useful to plug and abandon a well to use an existing slot to sidetrack into new payzones. This process is known as "slot recovery" and is very cost effective compared to drilling a new complete well well. Consequently, plug and abandonment (P&A) is an inevitable stage in a lifespan of a well.

In a typical P&A operation, operators remove existing completion hardware, set plugs and squeeze cement into an annulus at specified depths across producing and water-bearing zones to act as permanent barriers to pressure from above and below. Operators remove the wellhead last. One of the main problems in any cementing procedure is contamination. Poor mud-removal in areas where the cement is to be set can give rise to channels through the plug caused by the drilling fluid. To avoid this, a spacer is often pumped before and after the cement slurry to wash the hole and to segregate the drilling fluid and the cement from each other.

Different regulatory bodies have their own requirements for plugging operations. Most require that plugs be placed and tested across any open hydrocarbon-bearing formations, across all casing shoes, and across freshwater aquifers. More and more, metal or alloy plugs are used in place of or in conjunction with cement to meet these requirements.

SUMMARY OF THE INVENTION

The invention relates to methods, systems and devices for plug and abandonment operations to shut down a well or a portion thereof.

One example of the invention includes a method of plugging a hydrocarbon well, the method including deploying a downhole tool to remove at least a portion of a casing at a section of well to be plugged; deploying a blocking device downhole to block a bottom of the section of well to be plugged; deploying a plugging material downhole onto the blocking device to fill an area to be plugged; deploying an exothermic fluid downhole, wherein activation of the exothermic material liquefies the plugging material; and allowing the plugging material and the exothermic fluid to solidify form a cast-in-place plug that fills the section of well to be plugged.

Another example of the invention includes a through-tube method of plugging a hydrocarbon well, the method including deploying a downhole tool downhole to at least partially remove a tubular or a casing, at a section of well to be plugged; deploying a blocking device downhole to block a bottom of the section of well to be plugged; deploying a plugging material downhole onto the blocking device to fill an area to be plugged; deploying an exothermic fluid downhole to heat and form a liquefied plugging material; and allowing the liquefied plugging material to solidify and fill the section of well to be plugged.

DETAILED DESCRIPTION

The present disclosure provides systems, methods and devices for a P&A operation. The present invention describes ways to remove a short region of tubing and/or casing and access the plugging interval. The present invention may also be useful for non-abandonment plugging applications such as slot recovery, temporary abandonment, and the like. Developed herein is a method of plug and abandonment, which is shown schematically in various embodiments in the figures.

As used herein, "tubular" or "tubing" refers generically to any type of oilfield pipe, such as, but not limited to, drill pipes, drill collars, pup joints, casings, production tubings and pipelines. In some cases, the outer one or more tubing sets may be referred to as "casing" or "casings."

If a section of a well to be plugged is not cemented or is only poorly cemented, access to the annular space between the tubing and casing and/or between the outermost casing and reservoir is needed so that an abandonment plug can be placed right up the formation for a rock-to-rock plug. This can be accomplished by one or more steps as described herein.

Figure 1A:
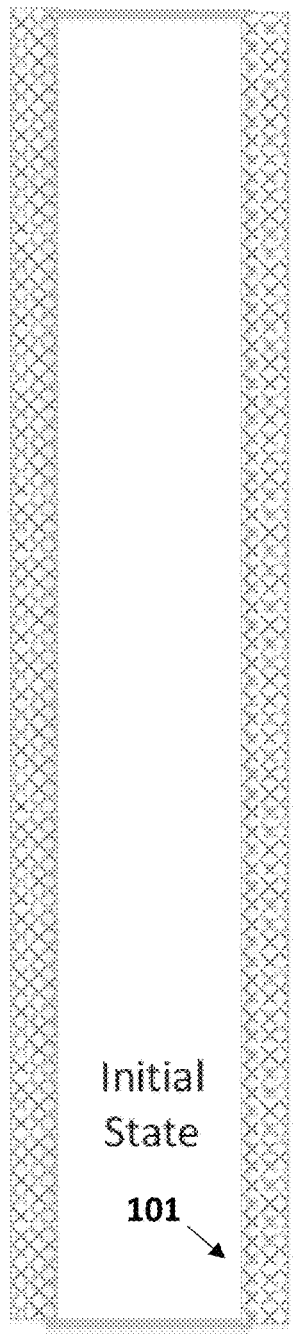
FIG. 1A-1H shows one embodiment of the inventive method as described in the specification.
Figure 1B:
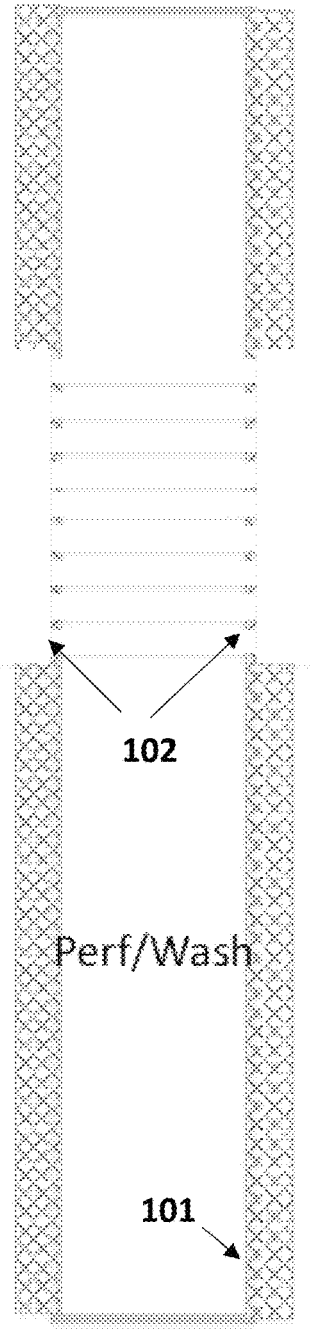

FIG. 1A shows a section of casing 101 to be plugged. This casing 101 is situated in a wellbore. FIG. 1B shows the casing 101 after a perforation and wash step using a perforate and wash tool (PWT). The PWT creates perforations 102 that exposes the annular space between the casing 101 and the wellbore. Typically, this annular space either lacks cement or lacks quality cement.

As used herein, a "perforate and wash tool" cuts small holes or slots in the tubulars and washes or cleans the perforated zone. This allows permanent rock-to-rock plugging to be possible during a single trip. These are typically used to convert a designated region of casing to production use, the plurality of discrete holes allowing ingress of oil. Such tools can also be used herein in the P&A process.

While this embodiment describes a perforation and wash method to access the casing annulus, other methods may also be used. These include, but are not limited to, cutting using cutters, section milling, perforating without washing, helical cutting using laser, propellants, and the like. Moreover, while FIGS. 1A-1H show only a single casing, this is not intended to be limiting. The present invention may be compatible with numerous casing and/or tubing configurations including one or more casing strings. All the steps of the present invention can be performed through-tubing, that is, without having to remove existing tubing.

As used herein, a "cutter" is any downhole tube that can be used to cut casing and/or tubing. A cutter is often used downhole when a tool is stuck to retrieve the tubing string and send down fishing tools. There are several different types of cutters including external cutter, chemical cutter, jet cutter, and the like. An external cutter is a type of cutter that slips over the fish or tubing to be cut. Special hardened metal-cutters on the inside of the tool engage on the external surfaces of the fish. A chemical cutter is usually run on wireline to sever tubing at a predetermined point when the tubing string has become stuck. When activated, the chemical cutter forcefully directs high-pressure jets of highly corrosive material in a circumferential pattern against the tubular wall. The nearly instantaneous massive corrosion of the surrounding tubing wall creates a relatively even cut with minimal distortion of the tubing, aiding subsequent fishing operations.

In some embodiments, the present method is considered a "through-tubing" method since at least a portion of the tubing is left in place for the P&A operation. However, the term "through-tubing" does not mean that no tubing may be removed at the section to be plugged. Nevertheless, the term "through-tubing" will be used because the entirety of the tubing need not be pulled out of the well prior to the P&A operation.

Typically, in conventional P&A, the tubing is pulled and the well is secured with barriers, plugs, fluid, or other methods and a Christmas tree is replaced with a blowout preventer. This blowout preventer will need to be large (~13 5/8 inches) which in turn requires expensive modular offshore drilling unit (MODU) offshore well installation.

An advantage of through tubing P&A is that the large blowout preventer (BOP) is not needed because the well can be fully secured by permanent plugs in the wellbore before removing the Christmas tree. As used herein, a "Christmas tree" refers to an assembly connected to the top of a well to direct and control drilling and/or production. Because use of MODU is avoided, cost is kept down significantly. On some installations, two wells can be plugged at the same time provided there is sufficient room for two or more P&A operations.

In some embodiments, perforation and wash can be performed in separate steps. Or alternative, the wash step may be optional. Scale, drilling mud, swarf (if present) can be washed using a tool (e.g., jet washer) drawn down on a coil tubing to clean out. It may be desirable to perform this wash later. Due to its relatively high specific gravity, debris will tend to float out.

Figure 1C:
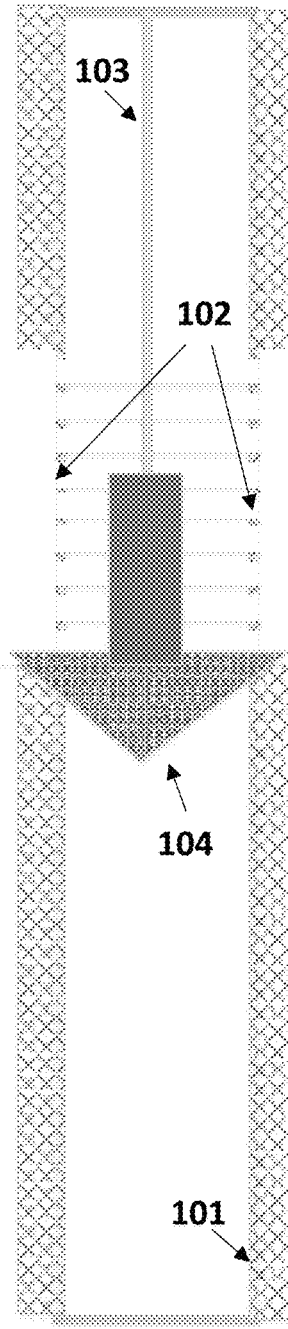
Figure 1D:
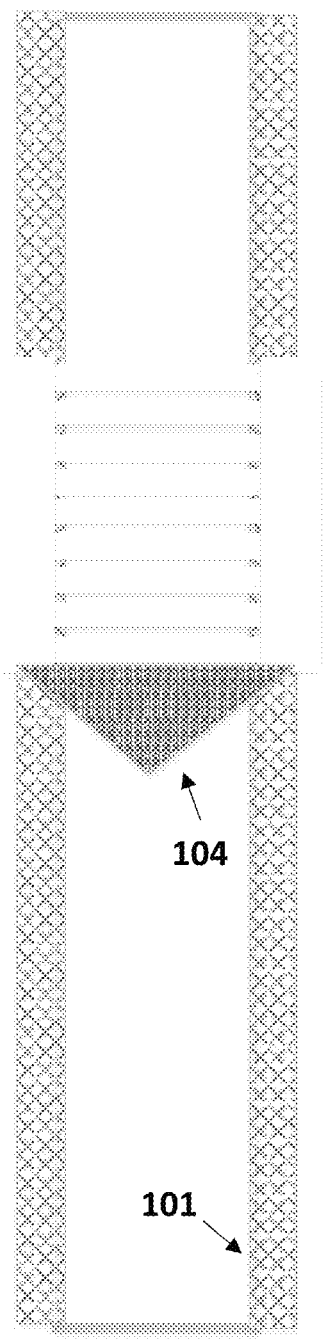

Referring to FIG. 1C, a blocking device 104 (e.g., inflatable basket) is lowered to a selected depth via a wireline 103. As shown in FIG. 1C, the blocking device 104 is installed near the perforated zone to form the bottom of a cavity. The blocking device 104 provide a base for the abandonment plug (introduced later). A blocking device is any device used to place settable materials (e.g., cement, resin, metal alloy, etc.) at the desired depth. The blocking device provides a stable base on which to set the cast-in-place abandonment plug. Suitable blocking devices include baskets, inflatable baskets, plugs, packers and the like. Other suitable blocking devices include cement plugs, barite plugs, sand plugs, resin plugs, and the like. Since the blocking device merely acts as a base for a permanent plug, it does not necessarily have to permanent as a standalone.

Figure 1E:
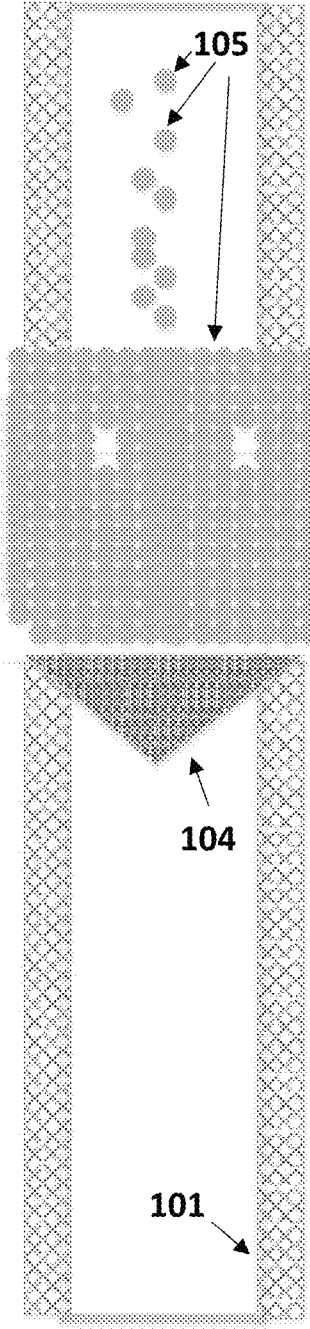

Once the blocking device 104 is installed (FIG. 1D), the wireline 103 can be retracted and the well is ready to be plugged. Referring to FIG. 1E, a plugging material 105 is introduced into the cavity. In the embodiment shown, the plugging material 105 is introduced as solid pellets that fill up the cavity space. The plugging material 105 can be, for example, a low melt alloy that expands upon solidification. The alloy can be placed by dropping with a dump bailer or dropping alloy pellets or chips from the surface. The cavity is filled with alloy pellets to the level desired. If needed, the cavity can be assessed at various times by an assessment tool such as a camera or sonic tool. These tools can be used as a downhole probe to determine cavity size and extent of access to the reservoir. This and similar verification steps may be useful initially but may be omitted once sufficient experience has been gained. If mapped, the cavity volume will be known and an appropriate number of pellets can be dumped. Levels can be confirmed by running wireline. The extra amount of alloy allows radial expansion, thus improving the seal.

In some embodiments, a low melt alloy may be combined with additional cement or resin or geopolymer plug. The combined material is used to set a cast-in-place abandonment plug according to regulations and/or as wellbore dictates. Low melt alloys or fusible alloys have low melting temperatures and can expand when solidifying from a liquid to a solid depending on the product.

Compatible low melt alloys include bismuth alloys that contain tin, bismuth lead, and the like. In general, bismuth alloys of approximately 50% bismuth exhibit little change of volume (1%) during solidification. Alloys containing more than this tend to expand during solidification and those containing less tend to shrink during solidification. Other bismuth alloy may include bismuth and germanium and/or copper. Bismuth alloys are desirable as cast-in-place abandonment plug material because they expand upon going from liquid to solid state (bismuth expands 1-3.32% on solidification). This allows the alloys to precisely conform to its surroundings. In a cast-in-place abandonment plug, the expansion means that the plug will expand to firmly contact the reservoir walls, as well as any metal casing or tubing, and provide a tight seal. Bismuth also has very low toxicity for a heavy metal. Unlike cement, these liquid alloys do not mix with other fluids. Consequently, channeling which is common in cement plugs can be avoided or significantly reduced.

The bismuth alloys may be released downhole as solid pellets or other convenient shapes. In its liquid form, the bismuth alloy has a water-like viscosity, easily penetrating and conforming to irregularities downhole. Because of the properties described herein, bismuth alloys can typically penetrate deeper into the reservoir as compared to cement. The bonding should also be tighter yet the final plug will be ductile. The high quality of the material and its bond allows a shorter length to be plugged, thus even if cutting or milling steps are performed, the interval is much shorter than typical, greatly saving time and cost.

In some embodiments, the plugging material may be a suitable metal. These include, for example, aluminum, lead, or other metal with melting temperature that can be reached by the exothermic reaction.

Exothermic reactions are typically the result of mixing two different materials. The reaction can be started by, external energy (ignitor i.e.), simply mixing the two materials together (resin/hardener; hydrogen peroxide/yeast), material exposed to certain type of fluid, or the materials reach a certain temperature. The exothermic energy generated can be calculated for any materials. The peak temperature can be determined. The temperature over time can be calculated and relationship of temperature/time developed.

The metal or alloy used should melt at a temperature below the calculated peak temperature. The exothermic material should remain in a liquid, powder, or pellet state until the metal can melt and flow to the plugging point by gravity segregation. Metal will solidify when temperature decreases or the metal falls below the point where the exothermic reaction is occurring.

The temperature in the well to be abandoned will also be a factor. As the temperature will be higher than ambient (30° C. to 100° C. plus) the heat from exothermic reaction will be lower than what is required on the surface. The downhole temperature must be considered when considering the type of metal and heat generated by the exothermic reaction.

The downhole temperature will determine the heat loss. The exothermic heat generated, energy to change state of the metal, and the heat loss can be calculated and overall thermal relationship developed for the time period. The relationship can be tested in the laboratory.

Figure 1F:
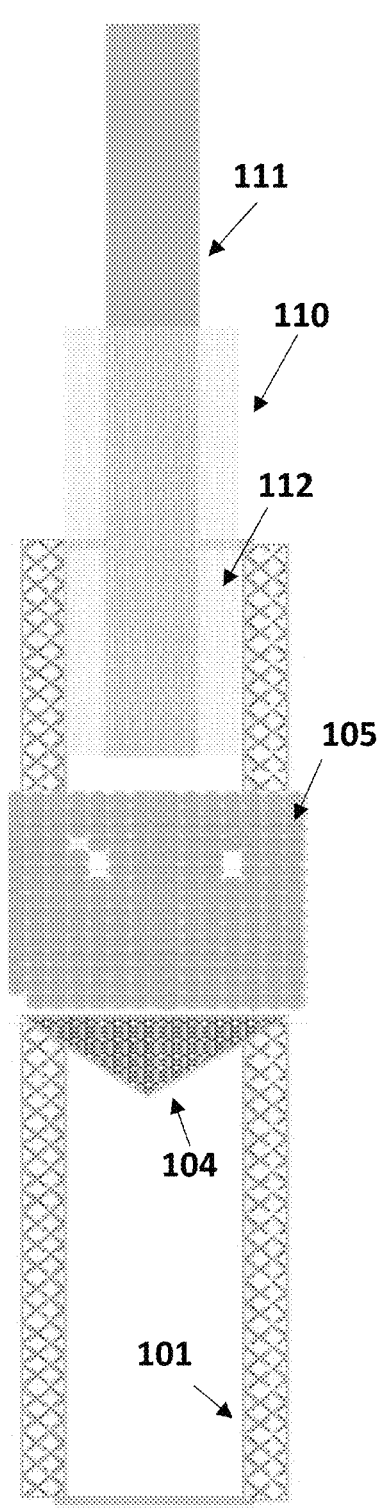

Referring to FIG. 1F, an exothermic material 110 is introduced into the cavity. The exothermic material 110 is initially in fluid form that can be introduced through tubing 111 and/or through the annular space 112 between the tubing 111 and casing 101. In some embodiments, the exothermic material 110 may be introduced via a bailer, through drill pipe, and/or ran through coil tubing.

There are several advantages of using an exothermic fluid over conventional methods (e.g., heater on a wireline or drill pipe). Conventional methods restrict the volume of metal that can be run. When using a single heater, approximately 30 feet of metal can be melted. Regulatory requirements typically require that the heater be pulled from the plug after heating. By contrast, the present invention does not place strict restrictions on the alloy volume that can be melted and placed. The alloy pellets can be easily dropped from the surface to fill the wellbore. Consequently, the alloy pellets do not have to run with wireline or on a drill pipe as molded assembly.

Figure 1G:
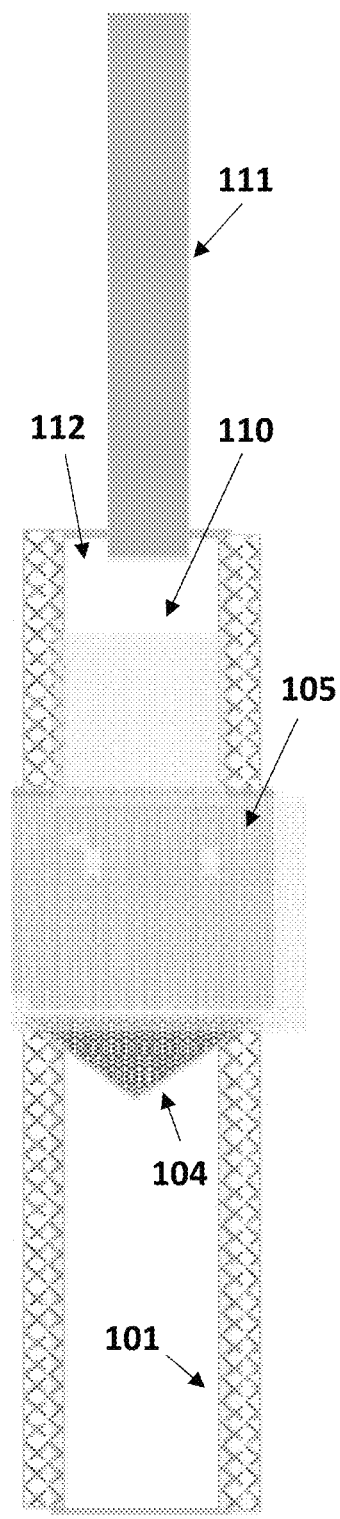

As shown in FIG. 1G, the exothermic material 110 settles to the bottom of the cavity, filling interstitial space created by the stacking of the plugging material 105. In some embodiments, the exothermic material 110 is immiscible with any wellbore fluids present so it does not become diluted. In some embodiments, the exothermic material 110 may have a density higher than one or more wellbore fluids. Once activated, the exothermic material 110 will release heat sufficient to melt the plugging material 105. When sufficiently heated, the plugging material 105 liquefy and easily flow into voids located in the wellbore and all around the casing fragments. This precludes the need for a squeeze step.

Suitable exothermic materials include, but are not limited to, epoxies, resins, cement (when setting), water and potassium chloride mixed, and the like. Activation of the exothermic material will depend on the type of material used. Amount of heat generated can be controlled by the type, amount of material(s) used, and the like. The resulting plug will be a two or more material plug that includes the alloy and the exothermic material. The alloy metal plug will typically expand when solidifying while the exothermic material can shrink. The simultaneous expansion of the alloy can offset shrinkage of the exothermic material.

Commercially available exothermic materials can be obtained from, for example, WEST SYSTEM® (Bay City, Mich., USA). WEST SYSTEM® provides epoxies that have peak exotherm temperatures (4 fluid ounce mixtures) ranging from about 155° C. to about 212° C. The time to reach the peak exotherm temperature can range from about 15 minutes to about 75 minutes. Insulating fillers can also be used to change peak temperature and time to peak temperature as needed.

Figure 1H:
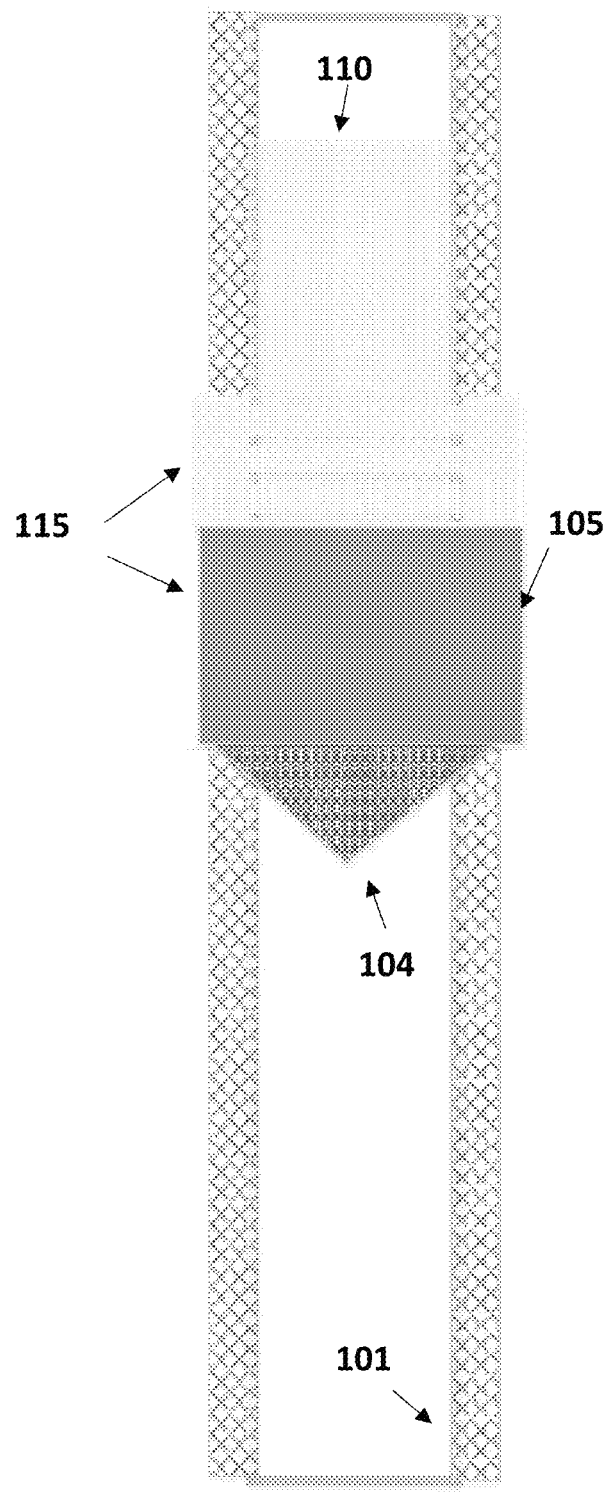

Referring to FIG. 1H, the plugging material 105 and the exothermic material 110 have solidified to form an abandonment plug 115. A shown, the solidified exothermic material 110 rests on top of the solidified plugging material 105. In one or more embodiments, the abandonment plug 115 can be further capped with cement or another material to meet regulatory requirements, or as otherwise needed. A cement plug can also be set under the cast-in-place abandonment plug. Alternatively, or in addition to, the abandonment plug can also be combined with a resin plug or a geopolymer plug, or combinations thereof. If needed, quality of the abandonment plug can be assessed by drilling a small hole to allow access for logging tools. Once assessment is complete, the small hole can be plugged with alloys, cement/resin, or something similar.

In some embodiments, the abandonment plugs can be pressure tested within hours (cement can require one or more days to set). Since a true metal-to-metal and metal-to-wall seals are made (no elastomers used), a permanent gas/liquid tight seal is created. Alloy plugs can be set in undamaged, damaged or even corroded casing. The alloy is inert, environmentally friendly and generally immune to corrosion and hydrogen sulfide or acid attacks.

The cast-in-place operation can be repeated as needed to set more alloy or other material until the cavity is filled to the desired level. If necessary, a squeezing step can be applied as well. If the selected alloy expands sufficiently, squeezing step may be avoided.

If desired or required by regulations, a bore can be made in the plug and a logging tool run to confirm the placement and quality of the plug. A drilling tool can be deployed with, e.g., coiled tubing, to allow logging or other tool to log the plug and confirm the quality. The logging tool can measure several different characteristics including i) radioactivity if safe radioactive material is placed in the plug material; ii) degree of bonding to the formation using a sonic or ultrasonic cement bond logging tool; or iii) other types of logging.

Once solid connection between the expanded casing and formation is confirmed, cement or alloy or other material refills hole over plug and may optionally provide a small overcap on plug. This is preferably done by using an alloy plug set in similar way, but cement or other material can be placed. Cement can be placed by coil tubing, dump bailed, or other compatible means.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

REFERENCES

All of the references cited herein are expressly incorporated by reference. The discussion of any reference is not an admission that it is prior art to the present invention, especially any reference that may have a publication date after the priority date of this application. Incorporated references are listed again here for convenience:

U.S. Pat. No. 6,474,414, (Gonzalez, et al.) "Plug for tubulars."

U.S. Pat. No. 6,664,522, (Spencer) "Method and apparatus for sealing multiple casings for oil and gas wells."

U.S. Pat. No. 6,828,531, (Spencer) "Oil and gas well alloy squeezing method and apparatus."

U.S. Pat. No. 6,923,263, (Eden & Eden) "Well sealing method and apparatus."

U.S. Pat. No. 7,152,657, (Bosma, et al.) "In-situ casting of well equipment."

U.S. Pat. No. 7,290,609, (Wardlaw, et al.) "Subterranean well secondary plugging tool for repair of a first plug."

US10113386, (Carragher), "Apparatus for Use in Well Abandonment."

US20060144591, (Gonzalez, et al.) "Method and apparatus for repair of wells utilizing meltable repair materials and exothermic reactants as heating agents."

US20100006289, (Spencer) "Method and apparatus for sealing abandoned oil and gas wells."

US20130333890, (Dagenais, et al.) "Methods of removing a wellbore isolation pdevice using a eutectic composition."

US20130087335, (Carragher & Richard) "Method and apparatus for use in well abandonment."

US20150345248, US20150368542, US20160145962, (Carragher) "Apparatus for use in well abandonment."

US20150368542, (Carragher) "Heat sources and alloys for us in down-hole applications."

US20150053405, (Bakken) "One trip perforating and washing tool for plugging and abandoning wells."

US-2018-0148991 (Hearn, et al), "Tool for Metal Plugging Or Sealing Of Casing."

US-2018-0094504 (Hearn, et al), "Nano-thermite Well Plug."

US-2018-0216437 (Shafer), "Through Tubing P&A With Two-Material Plugs."

US-2018-0258735 (Shafer), "Helical Coil Annular Access Plug and Abandonment."

US-2018-0298715 (Shafer), "Two-Material P&A Plug."

The invention claimed is:

1. A through-tube method of plugging a hydrocarbon well, comprising:
   a) deploying a downhole tool downhole to partially remove a tubular or a casing at a section of well to be plugged;
   b) deploying a blocking device downhole to block a bottom of said section of well to be plugged;
   c) deploying a plugging material downhole onto said blocking device to fill said section of well to be plugged;
   d) deploying an exothermic material downhole to heat said plugging material and form a liquefied plugging material, wherein the exothermic material is selected from the group consisting of epoxies, resins and hardener, cement, and water and potassium chloride; and,
   e) allowing the liquefied plugging material and said exothermic material to solidify and fill said section of well to be plugged, thereby forming a two or more material plug that includes said plugging material and said exothermic material.

2. The method of claim 1, wherein the downhole tool is selected from the group consisting of: a cutter, a section mill, perforate tool, perforate and wash tool, laser, and propellant.

3. The method of claim 1, wherein about 1 to 5 meters of casing is removed at said section of well to be plugged.

4. The method of claim 1, wherein the plugging material is a bismuth alloy, aluminum, or lead.

5. The method of claim 1, wherein the plugging material has a higher density than the exothermic material.

6. The method of claim 1, wherein the plugging material is deployed prior to deploying the exothermic material.

7. The method of claim 1, wherein the blocking device is a plug, a packer, or a basket.

8. The method of claim 1, wherein the plugging material expands upon solidification.

9. A through-tube method of plugging a hydrocarbon well, comprising:
   a) deploying a downhole tool downhole to partially remove a tubular or a casing at a section of well to be plugged;
   b) deploying a blocking device downhole to block a bottom of said section of well to be plugged;
   c) deploying a bismuth alloy downhole onto said blocking device to fill said section of well to be plugged;
   d) deploying an exothermic material downhole to heat said bismuth alloy and form a molten bismuth alloy, wherein the exothermic material is an epoxy or is water plus potassium chloride; and,
   e) allowing the molten bismuth alloy and said exothermic material to solidify and fill said section of well to be plugged, thereby forming a two or more material plug that includes said bismuth alloy and said exothermic material.

* * * * *